US006239642B1

(12) United States Patent
Kim et al.

(10) Patent No.: US 6,239,642 B1
(45) Date of Patent: May 29, 2001

(54) INTEGRATED CIRCUITS WITH VARIABLE SIGNAL LINE LOADING CIRCUITS AND METHODS OF OPERATION THEREOF

(75) Inventors: Jong-sun Kim, Kyungki-do; Sung-min Hwang; Ho-sung Song, both of Seoul, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/437,897

(22) Filed: Nov. 9, 1999

(30) Foreign Application Priority Data

Nov. 11, 1998 (KR) ........ 98-48168
May 3, 1999 (KR) ........ 99-15892

(51) Int. Cl.[7] ........ H03H 11/26
(52) U.S. Cl. ........ 327/276; 327/277; 327/283
(58) Field of Search ........ 327/268, 276, 327/277, 283, 284, 285, 143, 198, 525

(56) References Cited

U.S. PATENT DOCUMENTS 4,716,302 * 12/1987 Flannagan et al. ........ 327/525
4,894,791 * 1/1990 Jiang et al. ........ 327/276
5,428,310 * 6/1995 Casper et al. ........ 327/262
5,896,059 * 4/1999 Durham et al. ........ 327/525
5,936,474 * 8/1999 Rousselin ........ 331/177 V

FOREIGN PATENT DOCUMENTS 61-255600 11/1986 (JP) .

* cited by examiner

*Primary Examiner*—Toan Tran
(74) *Attorney, Agent, or Firm*—Myers Bigel Sibley & Sajovec

(57) ABSTRACT

A variable loading circuit for controlling signal transmission on a signal line in an integrated circuit includes a capacitor. A loading control circuit is responsive to a control signal to variably couple the signal line and a signal node through the capacitor and thereby vary signal transmission time on the signal line. In embodiments of the present invention, the loading control circuit includes a series combination of a fuse and one or more switches. The one or more switches are responsive to respective control signals to variably couple the signal line to the signal node through the fuse and the capacitor. The variable loading circuits can be used to reduce skew among signals in systems where signal timing is critical. Related methods are also described.

32 Claims, 9 Drawing Sheets

INTEGRATED CIRCUITS WITH VARIABLE SIGNAL LINE LOADING CIRCUITS AND METHODS OF OPERATION THEREOF

CROSS REFERENCE TO RELATED APPLICATION

This application claims the benefit of Korean Patent Application No. 98-48168, filed Nov. 11, 1998 and Korean Patent Application No. 99-15892, filed May 3, 1999, the disclosure of each of which is hereby incorporated herein by reference.

FIELD OF THE INVENTION

The present invention relates to integrated circuits and methods of operating thereof, and more particularly, to signal transmission circuits and methods for controlling signal transmission.

BACKGROUND OF THE INVENTION

Integrated circuits typically include circuit such as delay locked loops (DLLs) that provide distributed signals, e.g., clock signals, to multiple circuits. A DLL typically receives a reference clock signal from which it generates an internal clock signal, the phase of which typically depends on the reference clock signal. It may be desirable to operate a large number of circuits in synchronism with such an internal clock signal. If these circuits are driven in common, the total output load on the DLL can be very large, causing the DLL to consume a large amount of power. Consequently, integrated circuits such as merged memory logic (MML) devices, Rambus dynamic random access memories (RDRAMs), and double data rate (DDR) DRAMs often generate a plurality of synchronized DLL outputs (phases) and utilize a plurality of operation modes, such that the output signals produced by a circuit such as a DLL are selectively applied to circuits in the device to reduce unnecessary power consumption.

Proper operation of a device including a circuit such as a DLL often requires that phases produced by the circuit are accurately synchronized. However, because these output may be differently loaded, such synchronization may be problematic. Consequently, conventional DLLs may include delay circuits that can introduce delay into signals produced by the DLL.

FIG. 1 is a diagram of such a delay circuit, and FIG. 2 is a waveform diagram illustrating operations for such a circuit. When an input signal S1 to a first inverter G1 changes from a logic low level to a logic high level, a signal line n1 is driven low. However, because of charge stored in a capacitor C, the voltage at the signal line n1 falls more slowly than the corresponding rise in the input signal S1. This introduces a delay in the signal S2 generated by second inverter G2 connected to the signal line n1 with respect to the input signal S1. This delay can be reduced by opening the fuse F. However, the delay control afforded by the fuse F may be somewhat limited.

SUMMARY OF THE INVENTION

In light of the foregoing, it is an object of the present invention to provide improved control of transmission time for signals on a signal line of an integrated circuit.

This an other objects features and advantages may be provided according to the present invention by variable loading circuits and methods of operation thereof in which a loading control circuit variably couples a signal line of an integrated circuit to a signal node (e.g., a power supply node or a signal ground node) via a capacitor, responsive to a control signal applied to the loading control circuit. The variable loading circuit may further include a control signal generating circuit that generates the control signal. The loading control circuit may include a series combination of a fuse and one or more switches, e.g., MOS transistors, that are responsive to the control signal. The capacitor may be coupled to a control signal line generated by the control signal generating circuit. The fuse and switches of the various embodiments may be programmed and controlled, respectively, to provide flexible control of signal transmission time.

In particularly, according to an aspect off the present invention, a variable loading circuit for controlling signal transmission on a signal line in an integrated circuit includes a capacitor. A loading control circuit is responsive to a control signal to variably couple the signal line and a signal node through the capacitor and thereby vary signal transmission time on the signal line.

In embodiments of the present invention, the loading control circuit includes a series combination of a fuse and one or more switches. The one or more switches are responsive to respective control signals to variably couple the signal line to the signal node through the fuse and the capacitor. The one or more switches and the capacitor may include respective MOS transistors. The signal node may be a power supply node or a signal ground. The variable loading circuit may further include a control signal generating circuit coupled to the one or more switches and operative to generate one or more control signals for the one or more switches.

According to another aspect of the present invention, a variable signal transmission circuit includes an input circuit, such as a buffer, inverter or logic gate, configured to receive an input signal and to produce an intermediate output signal on an intermediate signal line. An output circuit, such as another buffer, inverter or logic gate, is configured to receive the intermediate output signal and to produce an output signal therefrom. A variable loading circuit includes a capacitor and a loading control circuit responsive to a control signal to variably couple the intermediate signal line and a signal node through the capacitor. The loading control circuit may include a series combination of a fuse and one or more switches, wherein the one or more switches are responsive to respective control signals to variably couple the intermediate signal line to the signal node through the fuse and the capacitor.

According to method aspects of the present invention, signal transmission on a signal line is controlled by generating a control signal and coupling the signal line and a signal node through a capacitor responsive to the control signal to thereby vary signal transmission time on the signal line. A signal transmission time or a capacitance for the signal line may be determined. The control signal may be generated based on the determined signal transmission time or capacitance. By varying transmission time (or capacitance) on multiple signal lines, signal skew between signals can be controlled.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
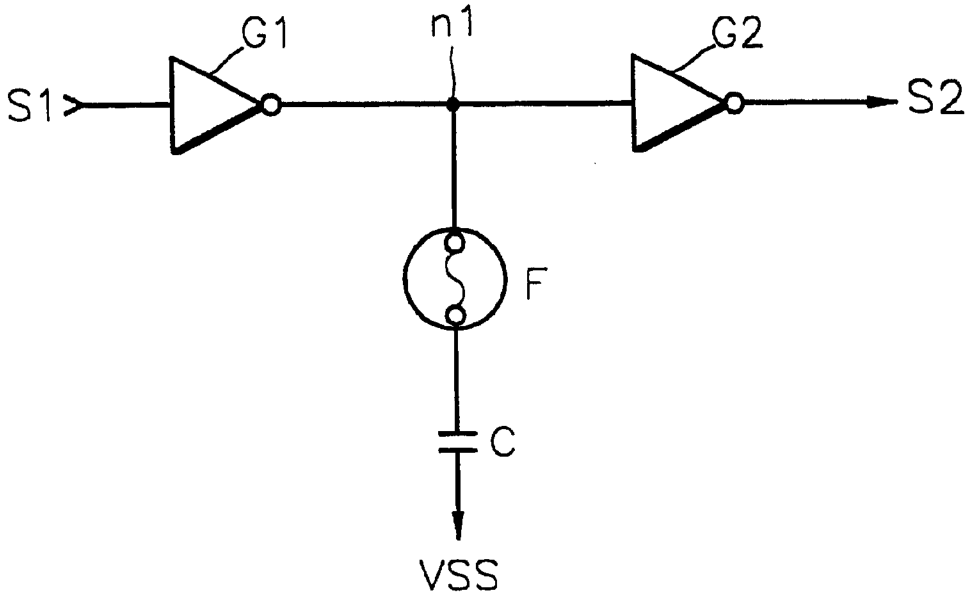
FIG. 1 (PRIOR ART)
FIG. 1 is a schematic diagram of a conventional delay control circuit.
Figure 2:
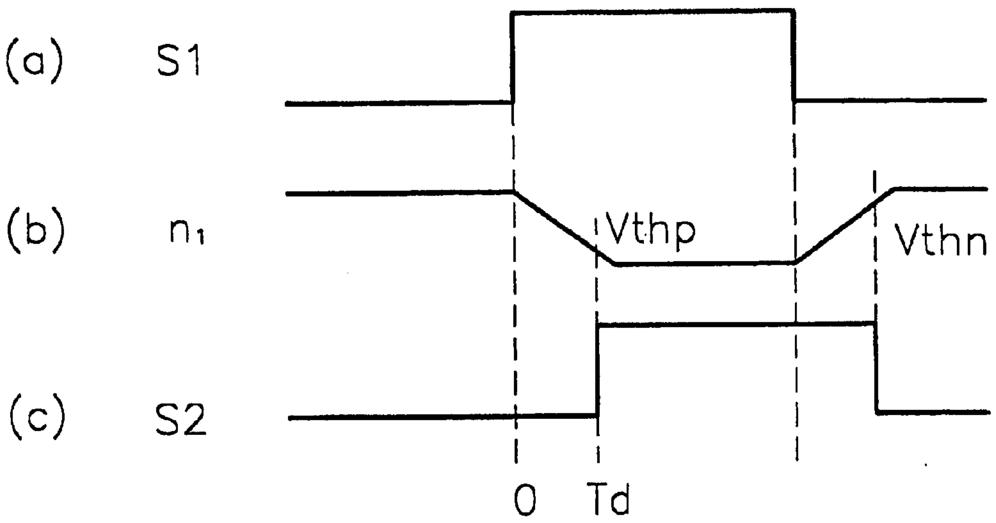
FIG. 2 (PRIOR ART)
FIG. 2 is a diagram for illustrating operations of the delay control circuit of FIG. 1.
Figure 3:
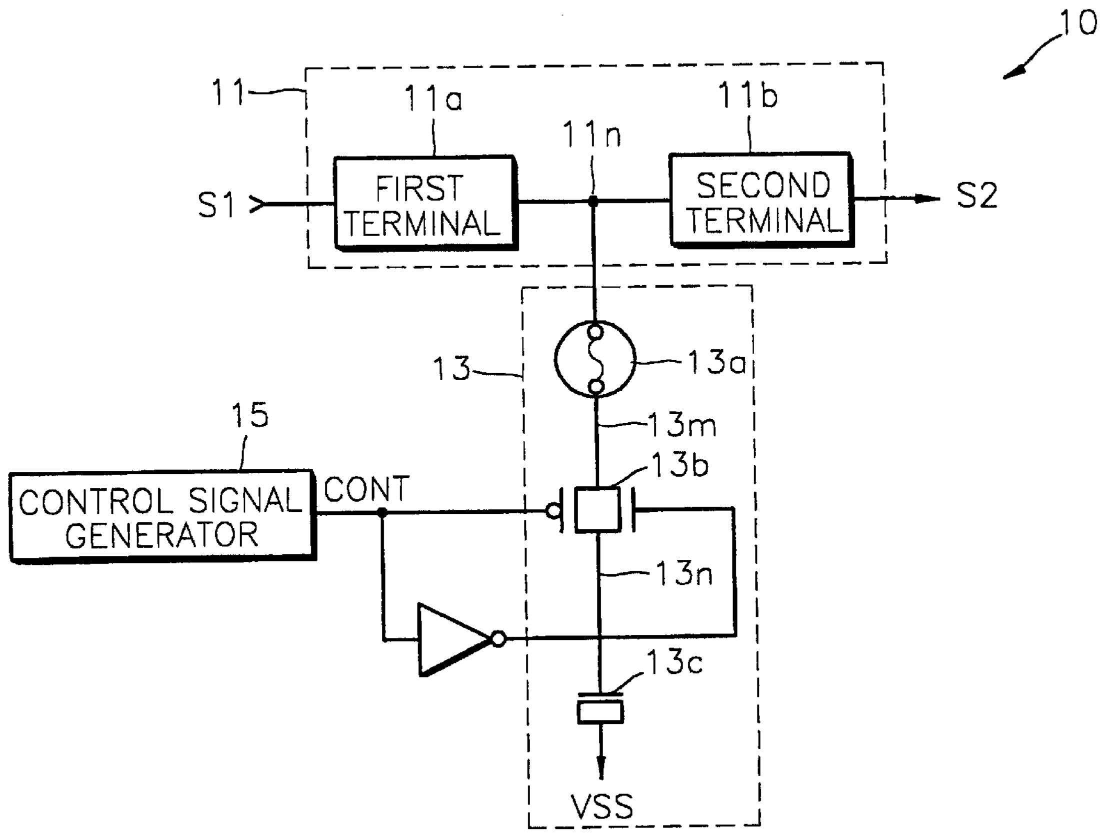
FIG. 3 is a schematic diagram illustrating a variable loading circuit according to one embodiment of the present invention.

FIG. 3 illustrates a variable signal transmission circuit 11 of an integrated circuit 10 according to an embodiment of the present invention. The variable signal transmission circuit 11 includes a variable loading circuit 12, including a loading control circuit 13 that variably couples a signal line 11*n* to a capacitor 14. As shown, the capacitor 14 is connected to a signal node having a fixed potential, here shown as a signal ground node VSS. The variable loading circuit 12 acts such that a signal S2 generated from an output circuit 11*b* in response to an input signal S1 received at an input circuit 11*a* can be variably delayed by controlling the loading on the signal line 11*n*. The delay introduced is dependent on the state of a fuse 13*a* and/or a control signal applied to a switch 13*b* on a control signal line CONT by a control signal generating circuit 15. It will be appreciated that FIG. 3 generally illustrates a portion of the integrated circuit 10, and, for example, the signal transmission circuit 11 may be connected to other circuits (not shown) within the integrated circuit 10.

The input and output circuits 11*a*, 11*b* can be any of a number of different types of circuits including, but not limited to, buffers, inverters, logic gates, active component circuits, passive component circuits and signal pads, wires or other signal conducting structures. It will be appreciated that the signal S1 may be a signal generated internally in the integrated circuit 10 or a signal generated externally to the integrated circuit 10. Similarly, the output signal S2 may be applied internally to one or more circuits of the integrated circuit 10 or to one or more externally located circuits. It will be appreciated that, in some cases, the signal line 11*n* may be directly connected to an external signal source, such that functions of the input circuit 11*a* are performed by a circuit external to the integrated circuit 10. It also will be appreciated that, in some cases, the signal line 11*n* may be directly connected to an external signal load, such that functions of the output circuit 11*b* are performed by a circuit external to the integrated circuit 10.

The load control circuit 13 includes a series combination of a fuse 13*a* and a switch, which can include, for example, a complementary (CMOS) transmission gate 13*b*, as shown. A first source/drain terminal of the transistor 13*b* is coupled to the signal line 11*n* by the fuse 13*a*. A second source/drain terminal of the transistor 13*b* is connected to the capacitor 14. The impedance provided by the transistor 13*b* can be varied responsive to the control signal on the control signal line CONT. The control signal may be generated by a signal externally supplied, or may be generated by a control signal generating circuit 15 included in the variable loading circuit 12.

The capacitor 14 may include a MOS transistor. For example, the capacitor 14 may include an NMOS transistor having a gate terminal connected to one of the source/drain terminals of the transmission transistor 13*b*, and first and second source/drain terminals commonly connected to the signal ground node VSS. Alternatively, the capacitor may include a PMOS transistor having a gate terminal connected to a source/drain terminal of the transistor 13*b*, and first and second source/drain terminals connected in common to the signal ground node VSS.

Figure 4:
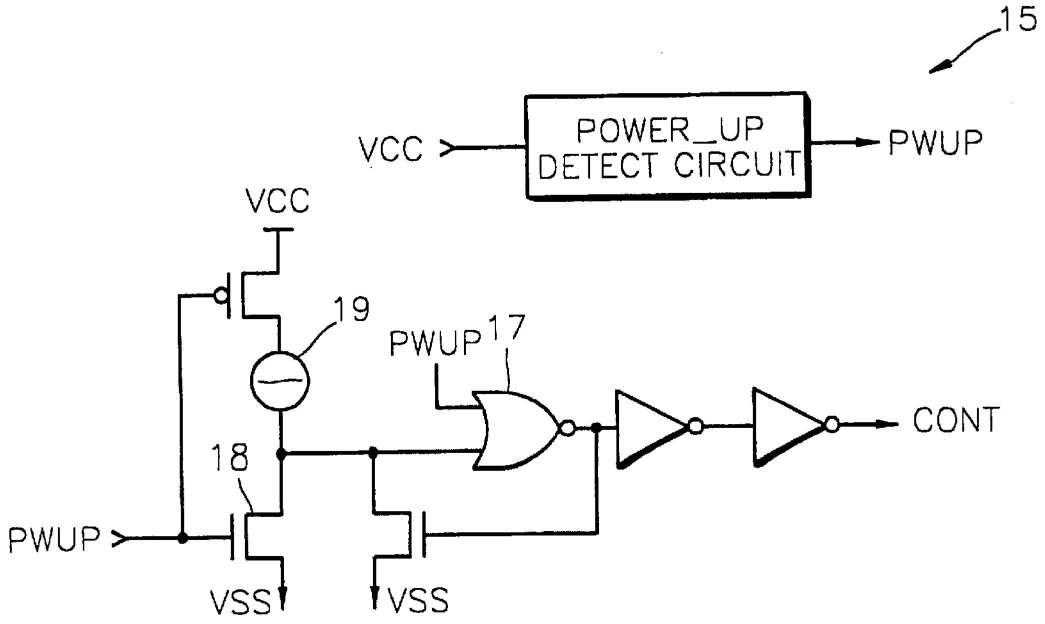
FIG. 4 is a schematic diagram illustrating a control signal generating circuit according to an embodiment of the present invention.

FIG. 4 illustrates a control signal generating circuit 15 according to an embodiment of the present invention, depending on the state of a fuse 19. The control signal generating circuit 15 is either responsive or non-responsive to a power up detect signal PWUP generated by a power up detect signal generating circuit 9 to generate a control signal on the control signal line CONT. The control signal generating circuit 15 includes a NOR gate 17 connected to a source/drain terminal of a NMOS transistor 18*b*, to a source/drain terminal of a PMOS transistor 18*a* through the fuse 19, and to a source/drain terminal of a second NMOS transistor 18*c*. The NOR gate 17 also receives the power up detect signal PWUP. The output of the NOR gate is connected to serially-connected inverters. When the fuse 19 is cut, the control signal on the control signal line CONT is asserted to a logic high level by a high level of the power up signal PWUP applied to PMOS and NMOS transistors 18*a*, 18*b*. The power up detect signal generating circuit 9 may generate the power up detect signal PWUP as a positive pulse in response to the voltage on the power supply node VCC reaching a predetermined level.

Figure 5:
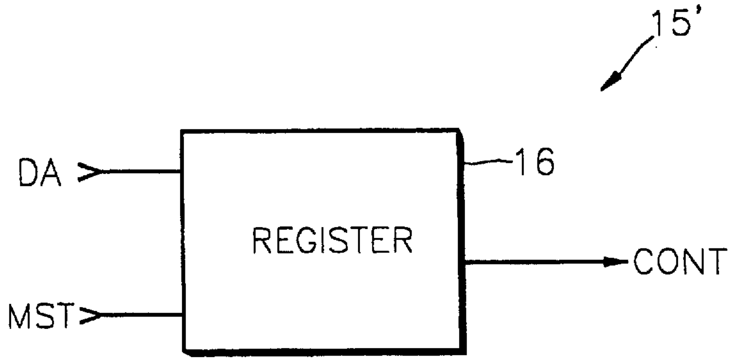
FIG. 5 is a schematic diagram illustrating a control signal generating circuit according to another embodiment of the present invention.

FIG. 5 illustrates a control signal generating circuit 15' according to another embodiment of the present invention. The control signal generating circuit 15' includes a control register 16. The control register 16 includes a flexibly programmable portion 16_2 and a control address generating portion 16_1 which generates control addresses ADDR0, ADDR1, and ADDR2. In this specification, for convenience' sake, it is described that the flexibly programmable portion 16_2 can flexibly change the state of the control signal CONT with the externally input signal.

Figure 5A:
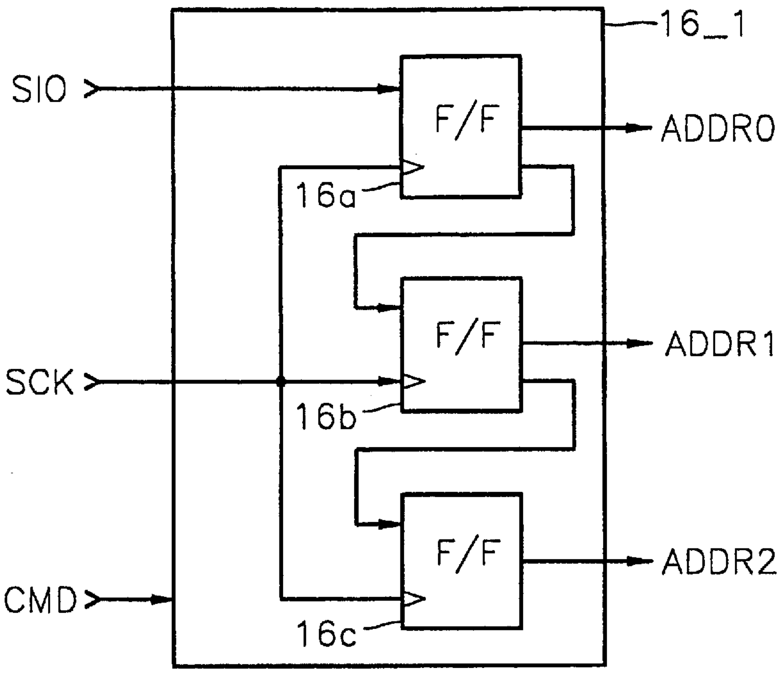
FIGS. 5A–5B illustrate respective portions of a control signal generating circuit according to other embodiments of the present invention.

FIG. 5A illustrates the control address generating portion of FIG. 5. The control address generating portion 16_1 include multiple flip-flops 16*a*, 16*b*, 16*c* which are serially connected to each other. A first flip-flop 16*a* receives a data signal SIO and a clock signal SCK as input signals. The first flip-flop 16*a* produces a first control address ADDR0 as an output signal. The functions of second and third flip-flops 16*b,* and 16*c* are similar to that of the first flip-flop 16*a.* A command signal CMD may enable the control address generating portion 16_1.

Figure 5B:
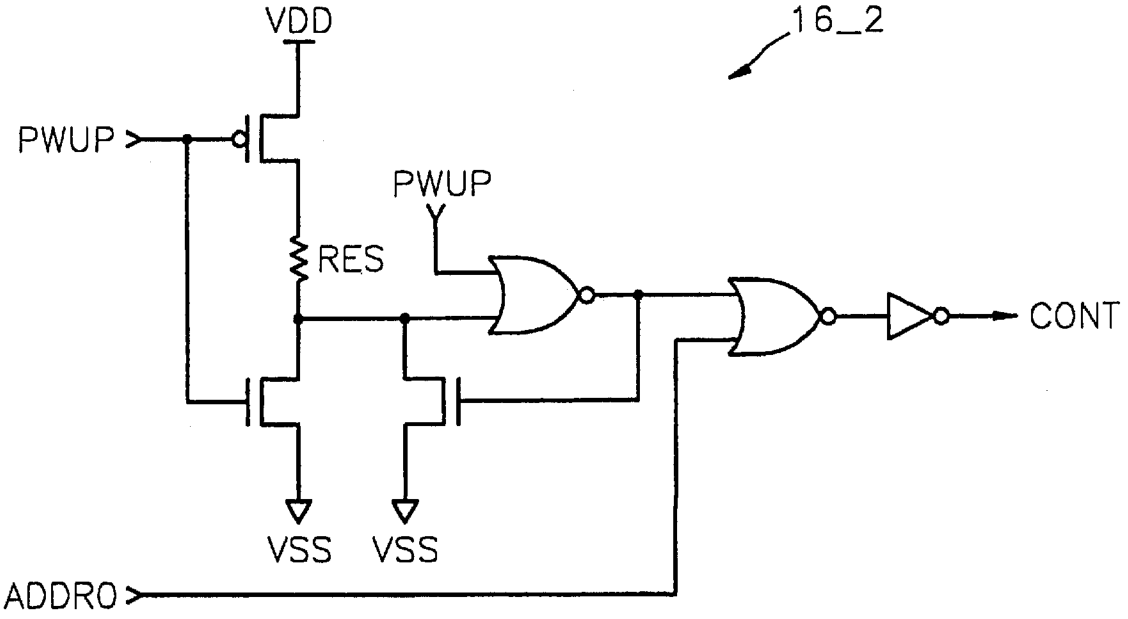

FIG. 5B illustrates the programmable portion 16_2 of FIG. 5. The programmable portion 16_2 generates the control signal CONT responsive to the control address ADDR0, when a register RES is intact. However, the control signal CONT does not respond to the control address ADDR0 when the register RES is cut. The resistor RES may be an electrical resistor which can be cut by applying an amount of current greater than a predetermined maximum current.

Figure 6:
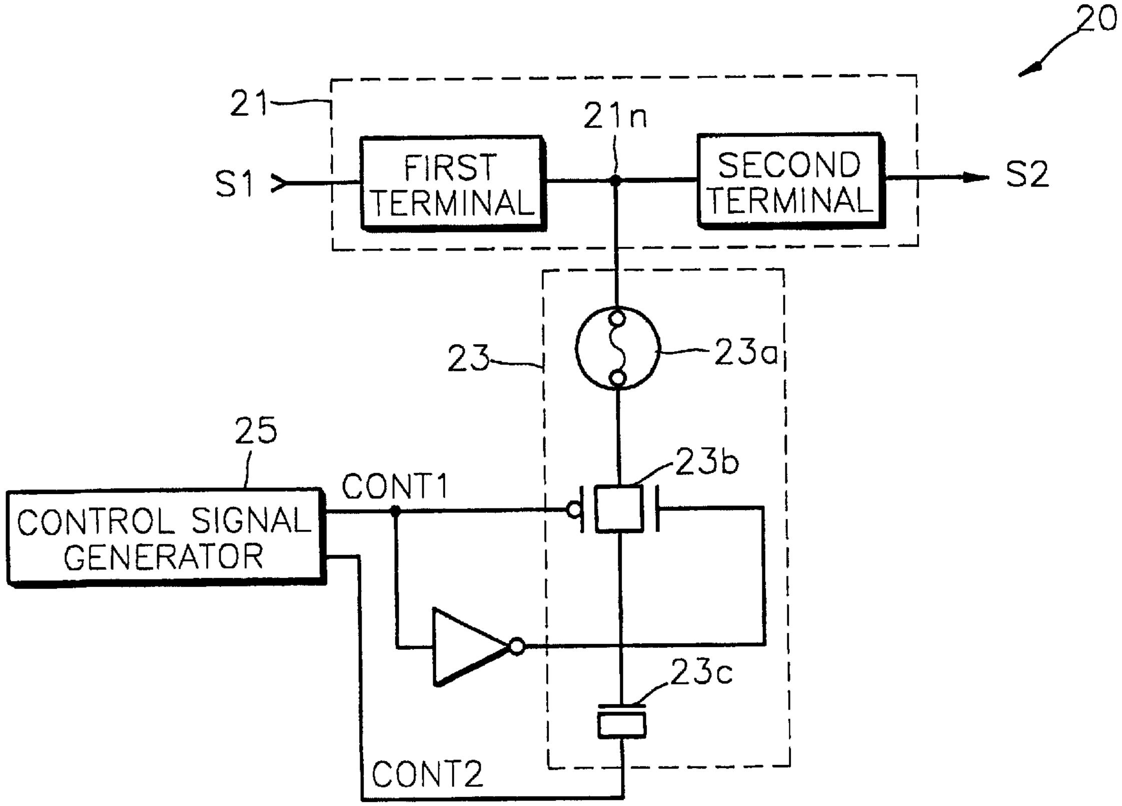
FIG. 6 is a schematic diagram illustrating a variable loading circuit according to another embodiment of the present invention.

FIG. 6 illustrates a signal transmission circuit 11' of an integrated circuit 10 according to another embodiment of the present invention. The signal transmission circuit 11' includes input and output circuits 11*a,* 11*b* connected by a signal line 11*n* as described with reference to FIG. 3. Similar to the embodiment of FIG. 3, a variable loading circuit 12' includes a loading control circuit 13' including a series combination of a fuse 13*a* and a transistor switch 13*b,* which is connected to a capacitor 14. However, unlike FIG. 3, the variable loading circuit 12' is responsive to both a first control signal applied to the transistor 13*b* on a first control line CONT1 and a second control signal on a second control line CONT2 connected to the capacitor 14. A control signal generating circuit 25' provides the first control signal on the first control signal line CONT1 and the second control signal on the second control signal line CONT2. The second control signal may, for example, be one of a power supply voltage or a signal ground. This can provide additional flexibility in controlling transmission time for signals on the signal line 11*n.* It will be appreciated that the control signals can alternately be provided from one or more sources external to the integrated circuit 10.

Figure 7:
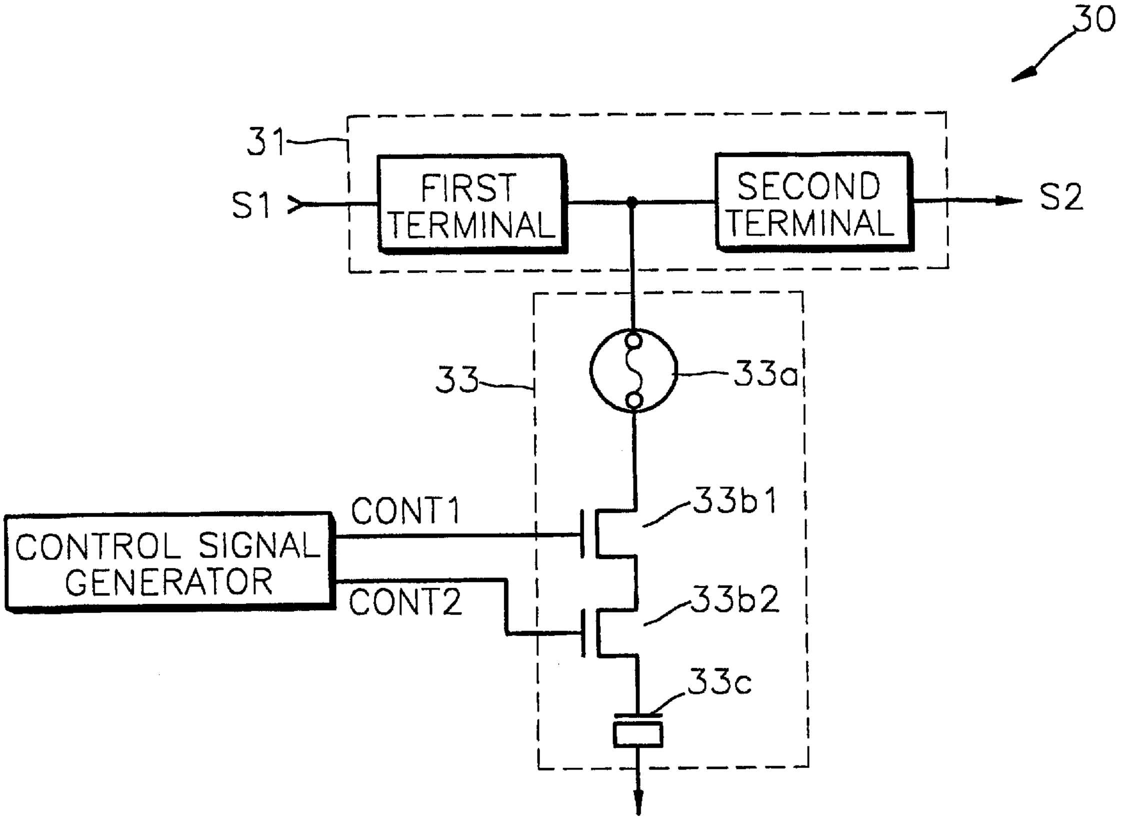
FIG. 7 is a schematic diagram illustrating a variable loading circuit according to yet another embodiment of the present invention.

FIG. 7 a view of a signal transmission circuit 11" for an integrated circuit 10 according to another embodiment of the present invention. The signal transmission circuit 11" includes a variable loading circuit 12". The variable loading circuit includes a capacitor 14, which is connected in series with a series combination of a fuse 13*a* and two transistor switches 13*b*1 and 13*b*2 of a loading control circuit 13". The switches 13*b*1, 13*b*2 are responsive to first and second control signals on first and second control signal lines CONT1, CONT2 that connect the switches 13*b*1, 13*b*2 to a control signal generating circuit 25". The transistors 33*b*1, 33*b*2 of the loading control circuit 13" can have different sizes.

The control signals applied on the control signal lines CONT1, CONT2 can take on many configurations. The transistors 13*b*1, 13*b*2 generally can be controlled to vary the resistance between the fuse and the capacitor 14, thus varying the total impedance provided by the variable loading circuit 12" and the delay introduced at the signal line 11*n.* It will be appreciated that more than two transistors may be provided in series with the fuse 13*a* and the capacitor 14, which can provide even more flexibility in controlling the impedance of the series combination.

Figure 8:
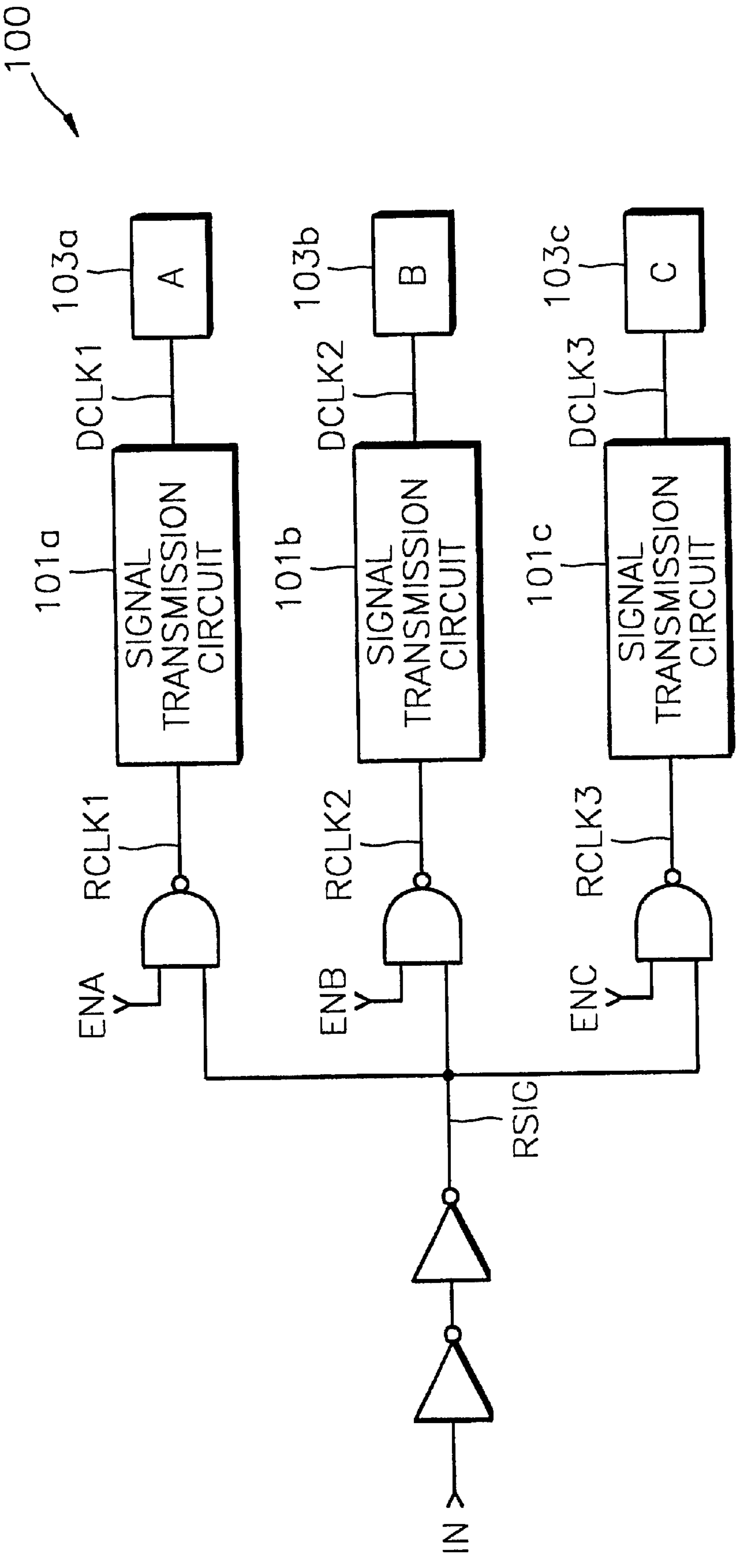
FIG. 8 is a circuit diagram illustrating application of variable loading circuits in signal transmission circuits according to an embodiment of the present invention.

FIG. 8 illustrates an exemplary application of variable signal transmission circuits according to the present invention. Respective ones of a plurality of variable signal transmission circuits 11*a,* 11*b,* 11*c* (e.g., circuits such as the variable signal transmission circuits 11, 11', 11" of FIGS. 3, 6 and 7) are used to delay respective signals RCLK1, RCLK2, RCLK3 derived from a signal RSIG produced from an input signal IN. Respective ones of the variable signal transmission circuits 11*a,* 11*b,* 11*c* produce respective delayed signals DCLK1, DCLK2, DCLK3 that are applied to respective target circuits 103*a,* 103*b,* 103*c.* Respective AND gates 101*a,* 101*b,* 101*c* are provided to gate the signal RSIG responsive to respective enable signals ENA, ENB, ENC to produce respective ones of the signals RCLK1, RCLK2, RCLK3. The gates 101*a,* 101*b,* 101*c* can be used to control power consumption, by disabling generation of selected ones of the signals RCLK1, RCLK2, RCLK3 when corresponding ones of the corresponding target circuits 103*a,* 103*b,* 103*c* do not require a clock signal.

Respective propagation delays associated with each of the respective delayed signals DCLK1, DCLK2, DCLK3 can be controlled by respective control signals applied on respective control signal lines CONTA, CONTB, CONTC connected to respective ones of the variable signal transmission circuits 11*a,* 11*b,* 11*c.* In this manner, skew between the delayed signals DCLK1, DCLK2, DCLK3 can be controlled. The control signals on the control signal lines CONTA, CONTB, CONTC can also be varied to control skew when loading conditions change due to the effects of the enable signals ENA, ENB, ENC.

Figure 9:
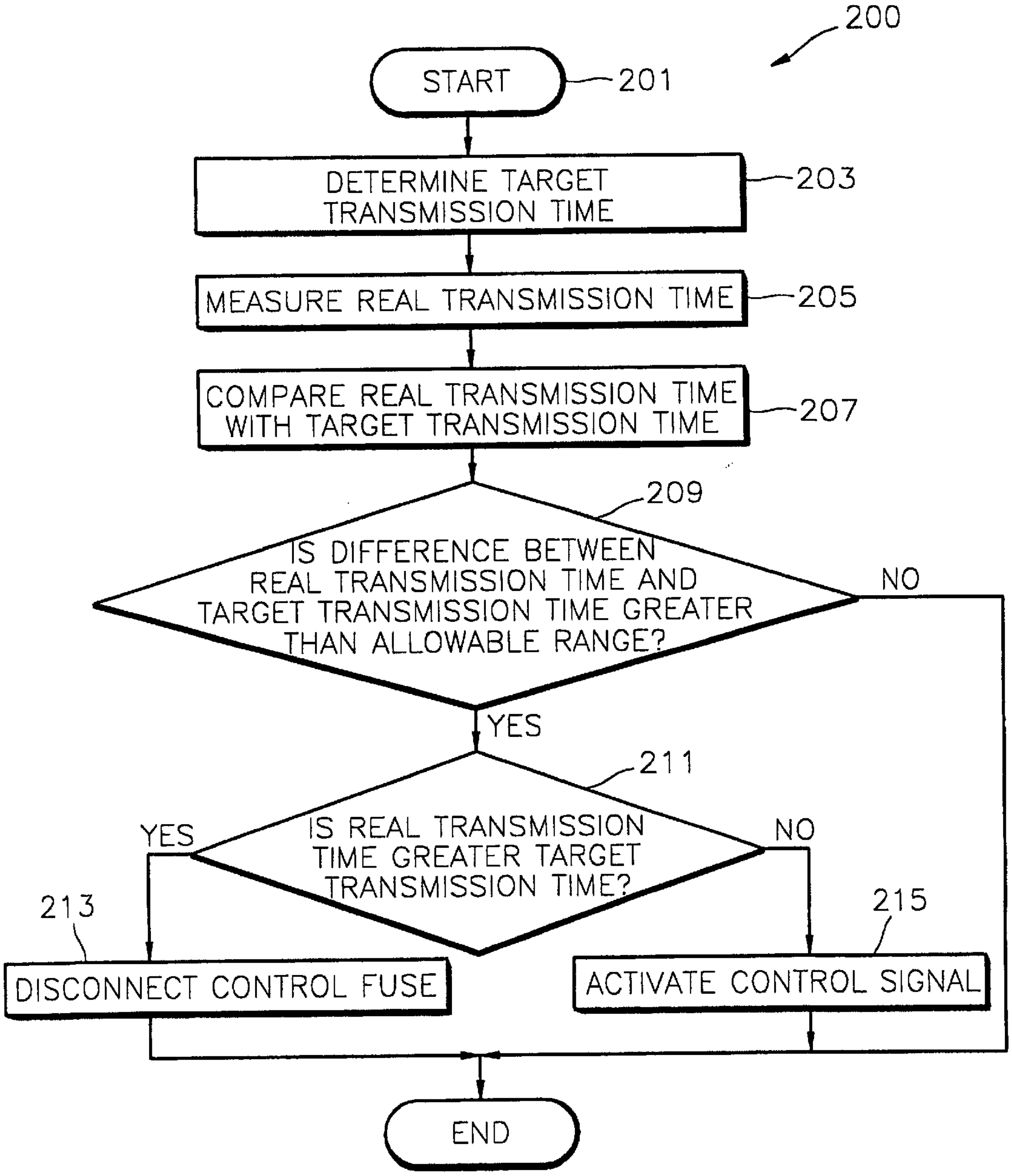
FIGS. 9 and 10 are flowcharts illustrating exemplary operations for controlling signal transmission time and signal line capacitance according to aspects of the present invention.

FIG. 9 illustrates exemplary operations 200 for adjusting transmission time in a variable signal transmission circuit according to an embodiment of the present invention, and will be described in with reference to the variable signal transmission circuit 11 of FIG. 3. A target transmission signal transmission time for the variable signal transmission circuit 11 is identified (Block 203). An actual signal transmission time for the variable signal transmission circuit 11 is measured (Block 205). The target and actual signal transmission times are compared (Block 207). If the difference is not outside of a predetermined range (Block 209), no adjustment is necessary. If the difference is outside of the predetermined range (Block 209) and the actual signal transmission time is greater than the target signal transmission time (Block 211), the fuse 13*a* in the loading control circuit 13 is opened to decouple the signal line from the capacitor 14 of the variable loading circuit 12 (Block 213) and limit the signal transmission time through the variable signal transmission circuit 11. If the difference is outside of the predetermined range (Block 209) and the actual signal transmission time is less than the target transmission time (Block 211), the fuse 13*a* is left intact, and the control signal on the control signal line CONT is placed in a state that causes the capacitor 14 to be coupled to the signal line 11*n* such that the signal transmission time through the variable signal transmission circuit 11 is increased to approximately the target transmission time.

Figure 10:
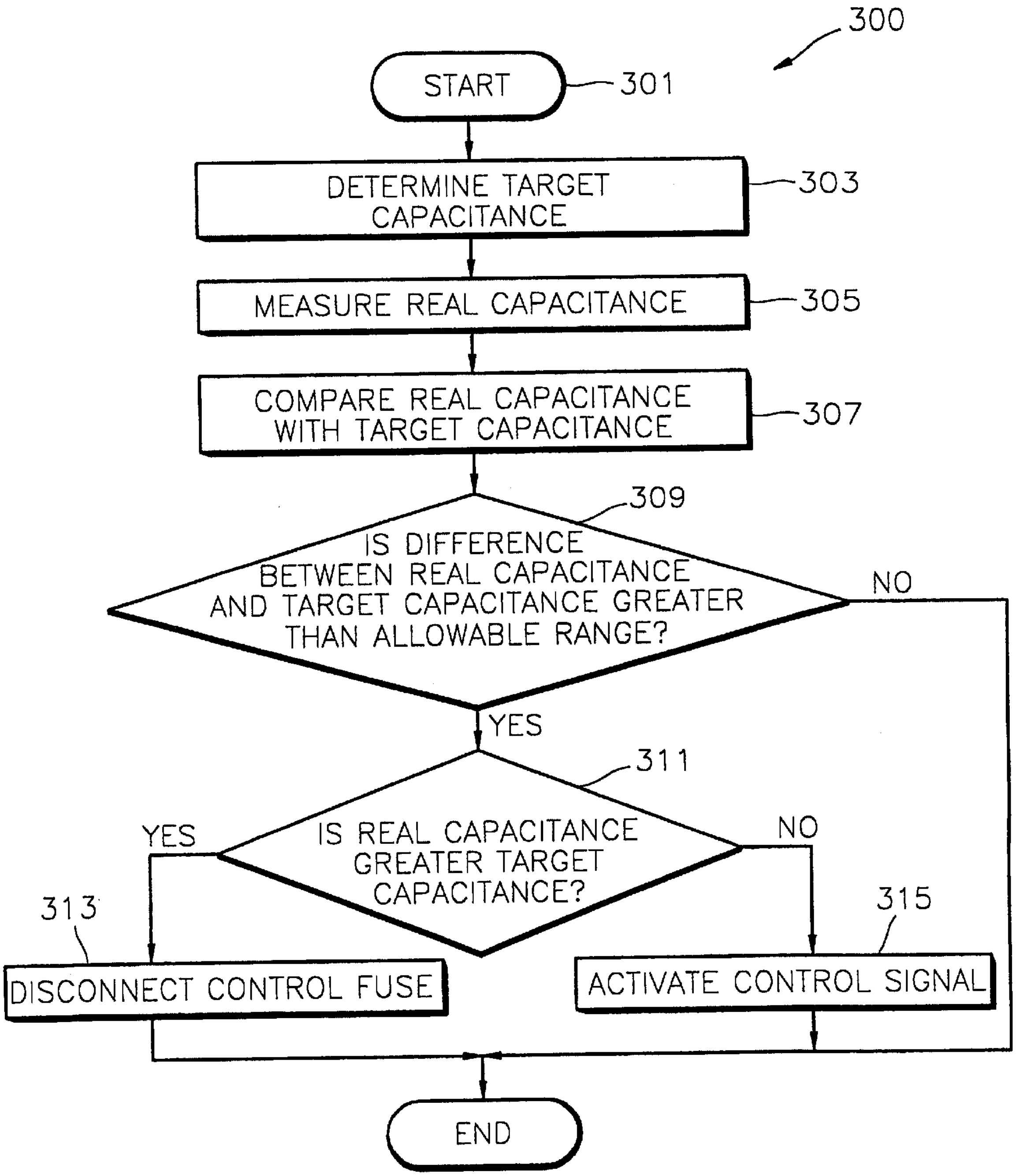

FIG. 10 illustrates exemplary operations 300 for adjusting transmission time in a variable signal transmission circuit according to another embodiment of the present invention, and will be described herein with reference to the variable signal transmission circuit 11 of FIG. 3. A target capacitance for the signal line 11*n* of the variable signal transmission circuit 11 is identified (Block 303). An actual capacitance for the signal line 11*n* of the variable signal transmission circuit 11 is measured (Block 305). The target and actual capacitances are compared (Block 307). If the difference is not outside of a predetermined range (Block 309), no adjustment is necessary. If the difference is outside of the predetermined range (Block 309) and the actual capacitance is greater than the target capacitance (Block 311), the fuse 13*a* in the loading control circuit 13 is opened to decouple the signal line from the capacitor 14 of the variable loading circuit 12 (Block 213) and limit the capacitance at the signal line 11*n*. If the difference is outside of the predetermined range (Block 309) and the actual capacitance is less than the target capacitance (Block 311), the fuse 13*a* is left intact, and the control signal on the control signal line CONT is placed in a state that causes the capacitor 14 to be coupled to the signal line 11*n* such that the capacitance at the signal line 11*n* is increased to approximately the target capacitance.

Figure 11:
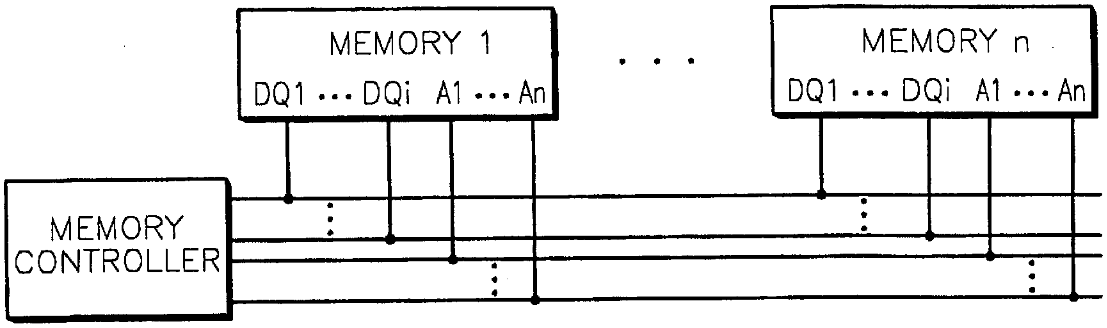
FIG. 11 is a schematic diagram illustrating an exemplary application of variable loading circuits according to an aspect of the present invention.

FIG. 11 illustrates another exemplary application for variable signal transmission circuits according to the present invention. A memory module includes a plurality of integrated circuit memory devices 1120-1, . . . , 1120-*n*, each having data pins DQ1, . . . , DQi and address pins A1, . . . , and corrected to common data lines DATA and common address lines ADDR, respectively, which are also connected to a memory controller 1110. The individual capacitances presented to the data lines DATA and the address lines ADDR by individual ones of the integrated circuit devices 1120-1, . . . , 1120-*n* may vary considerably due to, for example, manufacturing variation among the devices. If a large number of memory devices 1120-1, . . . , 1120-*n* are commonly connected, there may be a significant variance in capacitance among the data lines DATA and/or the address lines ADDR. This variance can cause considerable skew among signals on these lines, which can affect operation of the module. Variable signal transmission circuits, such as the signal transmission circuits 11, 11', 11" of FIGS. 3, 6 and 7, can be used in the integrated circuit devices 1110, 1120-1, . . . , 1120-*n* to reduce this skew.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A variable loading circuit for controlling signal transmission on a signal line in an integrated circuit, the variable loading circuit comprising:

a capacitor;

a loading control circuit including a switch responsive to a control signal to variably couple the signal line to a signal node through the capacitor;

a control signal generating circuit coupled to the loading control circuit and operative to generate the control signal responsive and non-responsive to a power up detect signal; and a power up detect signal generating circuit operative to generate the power up detect signal in response to application of a power supply voltage to the integrated circuit.

2. A variable loading circuit for controlling signal transmission on a signal line in an integrated circuit, the variable loading circuit comprising:

a capacitor;

a loading control circuit including a switch responsive to a control signal to variably couple the signal line to a signal node through the capacitor;

a control signal generating circuit coupled to the loading control circuit and operative to generate the control signal responsive to a power up detect signal; and a power up detect signal generating circuit operative to generate the power up detect signal in response to application of a power supply voltage to the integrated circuit; and wherein the loading control circuit further includes a fuse serially connected between the switch and the signal line.

3. A variable loading circuit according to claim 1, wherein the switch comprises a first MOS transistor, and wherein the capacitor comprises a second MOS transistor.

4. A variable loading circuit according to claim 2:

wherein the switch is responsive to a control signal to control impedance between first and second terminals of the switch;

wherein the fuse is connected between the first terminal of the switch and the signal line; and wherein the capacitor is connected between the second terminal of the switch and the signal node.

5. A variable loading circuit according to claim 4, wherein the signal node comprises one of a signal ground node or a power supply node.

6. A variable loading circuit according to claim 1, wherein the signal line comprises one of an input signal line that carries signals generated externally to the integrated circuit, an output signal line that carries signals generated by the integrated circuit, or an input/output signal line that carries both internally and externally generated signals.

7. A variable signal transmission circuit, comprising:

an input circuit configured to receive an input signal and to produce an intermediate output signal on an intermediate signal line;

an output circuit configured to receive the intermediate output signal and to produce an output signal therefrom; and a variable loading circuit including a fuse and a capacitor and a loading control circuit responsive to a control signal to variably couple the intermediate signal line and a signal node through the fuse and the capacitor.

8. A variable signal transmission circuit according to claim 7, wherein the variable loading circuit further comprises a control signal generating circuit coupled to the loading control circuit and operative to generate the control signal.

9. A variable signal transmission circuit according to claim 7, wherein the signal node comprises at least one of a signal ground node and a power supply node.

10. In an integrated circuit, a method of controlling signal transmission on a signal line, the method comprising the steps of:

determining a signal transmission time for the signal line;

generating a control signal based on the determined signal transmission time; and coupling the signal line and a signal node through a capacitor responsive to the control signal wherein the control signal is generated by a flexibly programmable control register to thereby vary signal transmission time on the signal line.

11. A variable loading circuit according to claim 10, wherein the control signal is responsive to a power-up detect signal.

12. A method according to claim 11, wherein said step of determining a signal transmission time is followed by a step of programming a fuse connected in series with the capacitor based on the determined signal transmission time.

13. A method according to claim 12, wherein said step of programming a fuse comprises the step of opening the fuse if the determined signal transmission time is greater than a predetermined time.

14. A method according to claim 12, wherein said step of generating the control signal comprises the steps of:

generating a first state in the control signal that causes the signal line to be coupled to the signal node through the capacitor when the determined signal transmission time is less than the predetermined time; and generating a second state in the control signal that causes the signal line to be decoupled from the signal node when the determined signal transmission time is greater than the predetermined time.

15. A method according to claim 10:

wherein said step of generating a control signal is preceded by the step of determining a capacitance of the signal line;

wherein said step of generating a control signal comprises the step of generating the control signal based on the determined capacitance; and wherein said step of coupling comprises the step of coupling the signal line to the signal node responsive to the control signal.

16. A method according to claim 15, wherein said step of determining a capacitance is followed by a step of programming a fuse connected in series with the capacitor based on the determined capacitance.

17. A method according to claim 16, wherein said step of programming a fuse comprises the step of opening the fuse if the determined capacitance is greater than a predetermined capacitance.

18. A method according to claim 10, wherein said step of generating the control signal comprises the steps of:

generating a first state in the control signal that causes the signal line to be coupled to a signal node through the capacitor when the determined capacitance is less than the predetermined capacitance; and generating a second state in the control signal that causes the signal line to be decoupled from the signal node when the determined capacitance is greater than the predetermined capacitance.

19. A variable loading circuit for controlling signal transmission on a signal line in an integrated circuit, the variable loading circuit comprising:

a capacitor;

a loading control circuit responsive to a control signal to variably couple the signal line and a signal node through the capacitor and thereby vary signal transmission time on the signal line, wherein the loading control circuit comprises a switch wherein the switch is responsible to the control signal to variably couple the signal line to the signal node through the capacitor; and a control signal generating circuit comprising at least one fuse that is coupled to the loading control circuit and operative to generate the control signal, wherein the control signal generating circuit comprises a control register operative to generate the control signal in response to external signal to the integrated circuit, and the control register that is programmable to render the control signal without cutting the fuse.

20. A variable loading circuit according to claim 19, wherein the loading control circuit further includes a fuse serially connected between the switch and the signal line.

21. The variable loading circuit according to claim 19, wherein the switch is a first MOS transistor and the capacitor comprises a second MOS transistor.

22. The variable loading circuit according to claim 21:

wherein the switch is responsive to the control signal to control impedance between the first and second terminal of the switch; and wherein the fuse is connected between the first terminal of the switch and the signal line, the capacitor connected between the second terminal of the switch and the signal node.

23. The variable loading circuit according to claim 22, wherein the signal node comprises one of a ground voltage node, a power supply voltage node and another voltage node which is not the ground voltage node or the power voltage node.

24. The variable loading circuit according to claim 19, wherein the signal line comprises one of an input signal line carries signals generated externally to the integrated circuit, an output signal generated by the integrated circuit, and an input/output signal line that carries both internally and externally generated signals.

25. The variable loading circuit according to claim 19, wherein the control register comprises at least one flip-flop logic gate and the inputs of the flip-flop logic gate are external signals to the integrated circuit.

26. The variable loading circuit according to claim 1, wherein the control signal is responsive to the power up detect signal when a fuse is cut.

27. The variable loading circuit according to claim 1, wherein the loading control circuit further includes a fuse serially connected between the switch and the signal line.

28. A variable loading circuit according to claim 27:

wherein the switch is responsive to a control signal to control impedance between first and second terminals of the switch;

wherein the fuse is connected between the first terminal of the switch and the signal line; and wherein the capacitor is connected between the second terminal of the switch and the signal node.

29. A variable loading circuit according to claim 28, wherein the signal node comprises one of a signal ground node or a power supply node.

30. A variable loading circuit for controlling signal transmission on a signal line in an integrated circuit, the variable loading circuit comprising:

a capacitor;

a loading control circuit including a switch responsive to a control signal to variably couple the signal line to a signal node through the capacitor;

a control signal generating circuit coupled to the loading control circuit and operative to generate the control signal responsive a pulsed power up detect signal; and a power up detect signal generating circuit operative to generate the pulsed power up detect signal in response to application of a power supply voltage to the integrated circuit.

31. A variable loading circuit according to claim 30, wherein said pulsed power up detect signal is generating while initiating the power supply voltage to the integrated circuit.

32. A variable loading circuit according to claim 10, wherein the signal node is at least one of a power supply node, a signal ground node and a predetermined voltage node.

* * * * *